US012575074B2

(12) United States Patent
Künzer et al.

(10) Patent No.: US 12,575,074 B2
(45) Date of Patent: Mar. 10, 2026

(54) MICROELECTRONIC DEVICE WITH STACKED TRANSISTORS

(71) Applicant: International Business Machines Corporation, Armonk, NY (US)

(72) Inventors: Jens Künzer, Boeblingen (DE); Tobias Werner, Weil im Schoenbuch (DE); Iris Maria Leefken, Dettenhausen (DE); Gerhard Hellner, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 523 days.

(21) Appl. No.: 18/145,507

(22) Filed: Dec. 22, 2022

(65) Prior Publication Data

US 2024/0121934 A1    Apr. 11, 2024

(30) Foreign Application Priority Data

Oct. 11, 2022    (GB) ..................................... 2214943

(51) Int. Cl.
*H10B 10/00*        (2023.01)

(52) U.S. Cl.
CPC .................................. *H10B 10/125* (2023.02)

(58) Field of Classification Search
None
See application file for complete search history.

(56) References Cited

U.S. PATENT DOCUMENTS

| | | | |
|---|---|---|---|
| 9,711,511 B1 | 7/2017 | Lim et al. | |
| 10,283,411 B1 | 5/2019 | Hook | |
| 2003/0136978 A1 | 7/2003 | Takaura | |
| 2004/0100810 A1* | 5/2004 | Towler | G11C 15/04 |
| | | | 365/49.17 |
| 2009/0141536 A1* | 6/2009 | Gonzalez | G11C 11/4125 |
| | | | 365/154 |

(Continued)

FOREIGN PATENT DOCUMENTS

| | | |
|---|---|---|
| WO | 2020099962 A1 | 5/2020 |

OTHER PUBLICATIONS

UK Application No. GB2214943.9 Search Report under Section 17(5) mailed Mar. 31, 2023, 3pgs.

(Continued)

*Primary Examiner* — Khaja Ahmad

(74) *Attorney, Agent, or Firm* — L. Jeffrey Kelly

(57)        ABSTRACT

A processor may form a first power line and a second power line. The processor may form a first memory cell with at least six transistors and a second memory cell with at least six transistors. The first pair of transistors of the first memory cell may be stacked vertically and connected at a common net. The common net may be arranged transverse to the first pair of transistors. The first pair of transistors may be configured to share the first power line. The second pair of transistors of the first memory cell may be stacked vertically and connected at a common net. The common net may be arranged transverse to the second pair of transistors. The second pair of transistors may be configured to share the second power line. The transistors of the first pair of transistors are configured to operate independently from the second pair of transistors.

19 Claims, 10 Drawing Sheets

(56)  References Cited

U.S. PATENT DOCUMENTS

| 2014/0315363 A1* | 10/2014 | Balakrishnan | H10D 86/201 |
| | | | 438/233 |
| 2015/0318288 A1* | 11/2015 | Lim | H10D 30/025 |
| | | | 257/329 |
| 2017/0110180 A1* | 4/2017 | Guo | G11C 11/419 |
| 2017/0358586 A1 | 12/2017 | Huynh Bao | |
| 2018/0342290 A1* | 11/2018 | Yu | G11C 5/147 |
| 2019/0096894 A1* | 3/2019 | Bell | H10B 10/125 |
| 2020/0161310 A1 | 5/2020 | Pille | |
| 2020/0161311 A1 | 5/2020 | Pille | |
| 2020/0161312 A1 | 5/2020 | Pille | |
| 2021/0167072 A1 | 6/2021 | Makosiej | |
| 2021/0202499 A1 | 7/2021 | Gardner | |

OTHER PUBLICATIONS

Tallis, B., Micron 3D NAND Status, https://web.archive.org/web/20160213093225/https://www.anandtech.com/show/10028/micron-3d-nand-status-update, Feb. 12, 2016, 5 pages.

* cited by examiner

MICROELECTRONIC DEVICE WITH STACKED TRANSISTORS

BACKGROUND

The present invention relates in general to data processing systems, and more particularly to a microelectronic device and a method of forming a microelectronic device.

When producing microelectronic devices, a number of process layers are formed on a substrate, each process layer incorporating a layout pattern. The layout patterns within the various layers establish component features and interconnections such that once the final process layer has been formed, a microelectronic device has been produced containing the required circuit components interconnected in the manner required to perform the functions of the microelectronic device.

Mostly, microelectronic devices include multiple adjacent layers which are deposited and structured one after the other. Power supply rails are provided to supply power to the cells of the microelectronic device. Cells of the microelectronic device may include static random access memory (SRAM) cells for storing data and logic cells for performing combinatorial logic functions, such as using NAND gates and NOR gates. Signal lines are provided for transmitting data, for example, the result of a Boolean operation or data (to be) stored in a cell (e.g., a SRAM cell). The cells of the microelectronic device include field effect transistors (FETs), each including a drain region, a source region, a channel region, and a gate region. Typically, the FETs are formed in the lowest layers of the microelectronic device. The layers comprising the signal lines and the power supply rails are provided in layers above the FETs.

SUMMARY

Embodiments of the present disclosure include an apparatus. method, and system for a microelectronic device.

A processor may form a first power line. The processor may form a second power line. The processor may form a first memory cell with at least six transistors. The processor may form a second memory cell with at least six transistors. The first pair of transistors of the first memory cell may be stacked vertically and connected at a common net. The common net may be arranged transverse to the first pair of transistors. The first pair of transistors may be configured to share the first power line. The second pair of transistors of the first memory cell may be stacked vertically and connected at a common net. The common net may be arranged transverse to the second pair of transistors. The second pair of transistors may be configured to share the second power line. The transistors of the first pair of transistors are configured to operate independently from the second pair of transistors.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
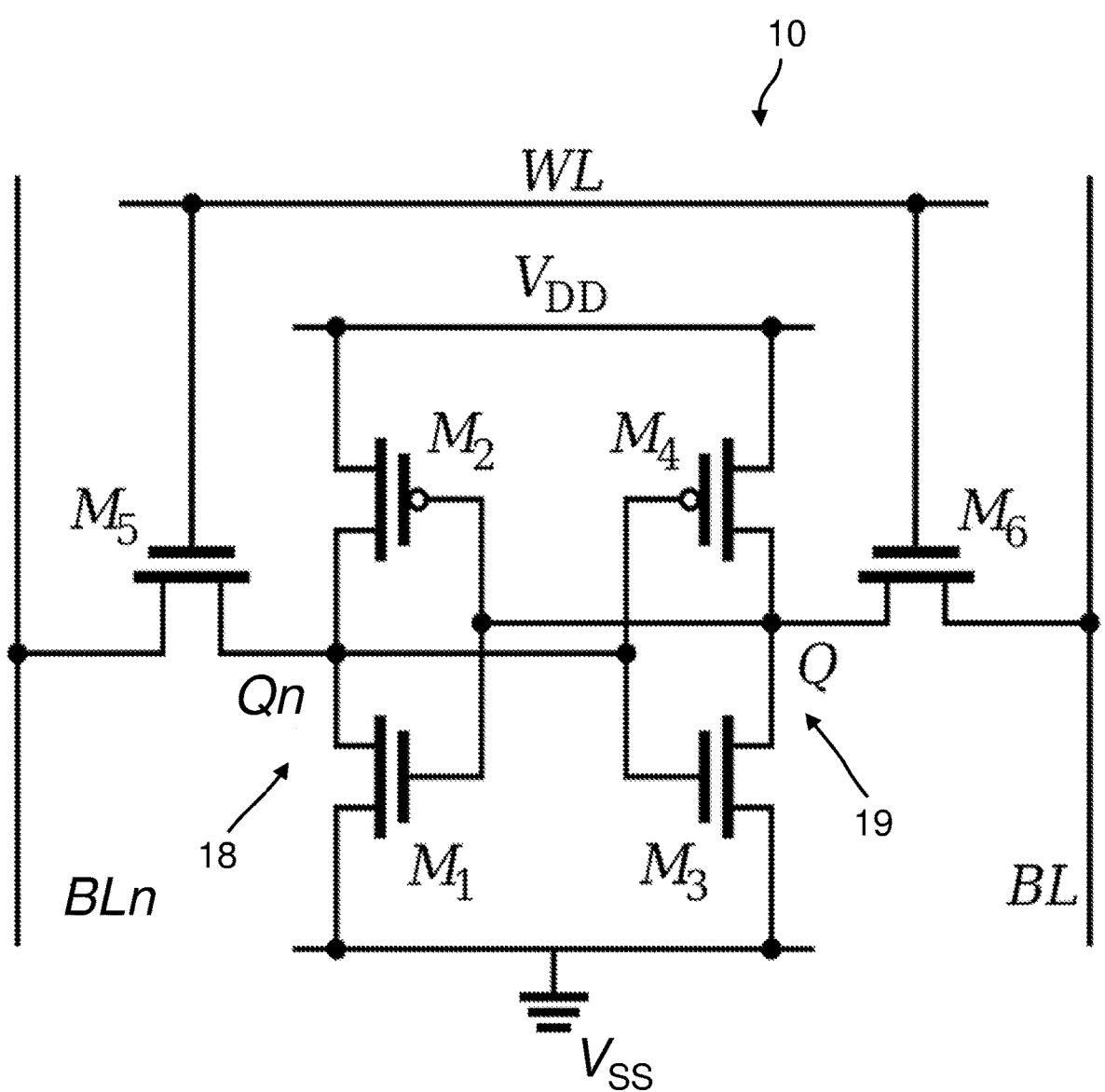
FIG. 1 depicts a circuit diagram of an SRAM memory cell comprising six transistors according to state of the art, in accordance with aspects of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the disclosure.

DETAILED DESCRIPTION

In the drawings, like elements are referred to with equal reference numerals. The drawings are merely schematic representations, not intended to portray specific parameters of the invention. Moreover, the drawings are intended to depict only some embodiments of the invention and therefore should not be considered as limiting the scope of the invention.

The illustrative embodiments described herein disclose a microelectronic device that may comprise a plurality of conducting layers. The microelectronic device may comprise a first memory cell with at least six transistors, a second memory cell with at least six transistors. A first pair of transistors of the first memory cell may be stacked vertically and connected at a common net. More particularly, the first pair of transistors of the first memory cell may be connected at a common net arranged transverse to the first pair of transistors. Each transistor of the first pair of transistors may be of the same type. The first pair of transistors may be configured to share a first common power line. A second pair of transistors of the first memory cell may be stacked vertically and connected at a common net. More particularly, the first pair of transistors of the first memory cell may be connected at a common net arranged transverse to the second pair of transistors. Each transistor of the second pair of transistors may be of the same type (e.g., referring to polarity and/or transistor types) and may be a different type than the first pair of transistors. The second pair of transistors may be configured to share a second common power line. The transistors of the first and second pair of transistors may be configured to operate independently from each other.

The illustrative embodiments are sometimes described herein using particular technologies, such technologies are for example only and should not be construed as limiting.

FIG. 1 depicts a circuit diagram of an SRAM memory cell 10 comprising six transistors referred to as $M_1$, $M_2$, $M_3$, $M_4$, $M_5$, $M_6$, respectively.

A first pair of transistors $M_1$, $M_3$ may be connected to a first power line $V_{ss}$ and a second pair of transistors $M_2$, $M_4$ may be connected to a second power line $V_{dd}$.

The memory cell 10 may comprise a first inverter 18 with a first transistor $M_1$ and a second transistor $M_2$ and a second inverter 19 with a first transistor $M_3$ and a second transistor $M_4$. The first inverter 18 and the second inverter 19 may be cross coupled. The first inverter 18 inverts a true signal Q and drives a complement signal Qn. In some embodiments, the second inverter 19 may invert a complement signal Qn and drive a true signal Q.

A gate of the transistor $M_5$ and a gate of the transistor $M_6$ may be connected to a wordline WL. A drain of the transistor $M_5$ may be connected to a complement bitline BLn and a drain of the transistor $M_6$ may be connected to a true bitline BL.

Figure 2:
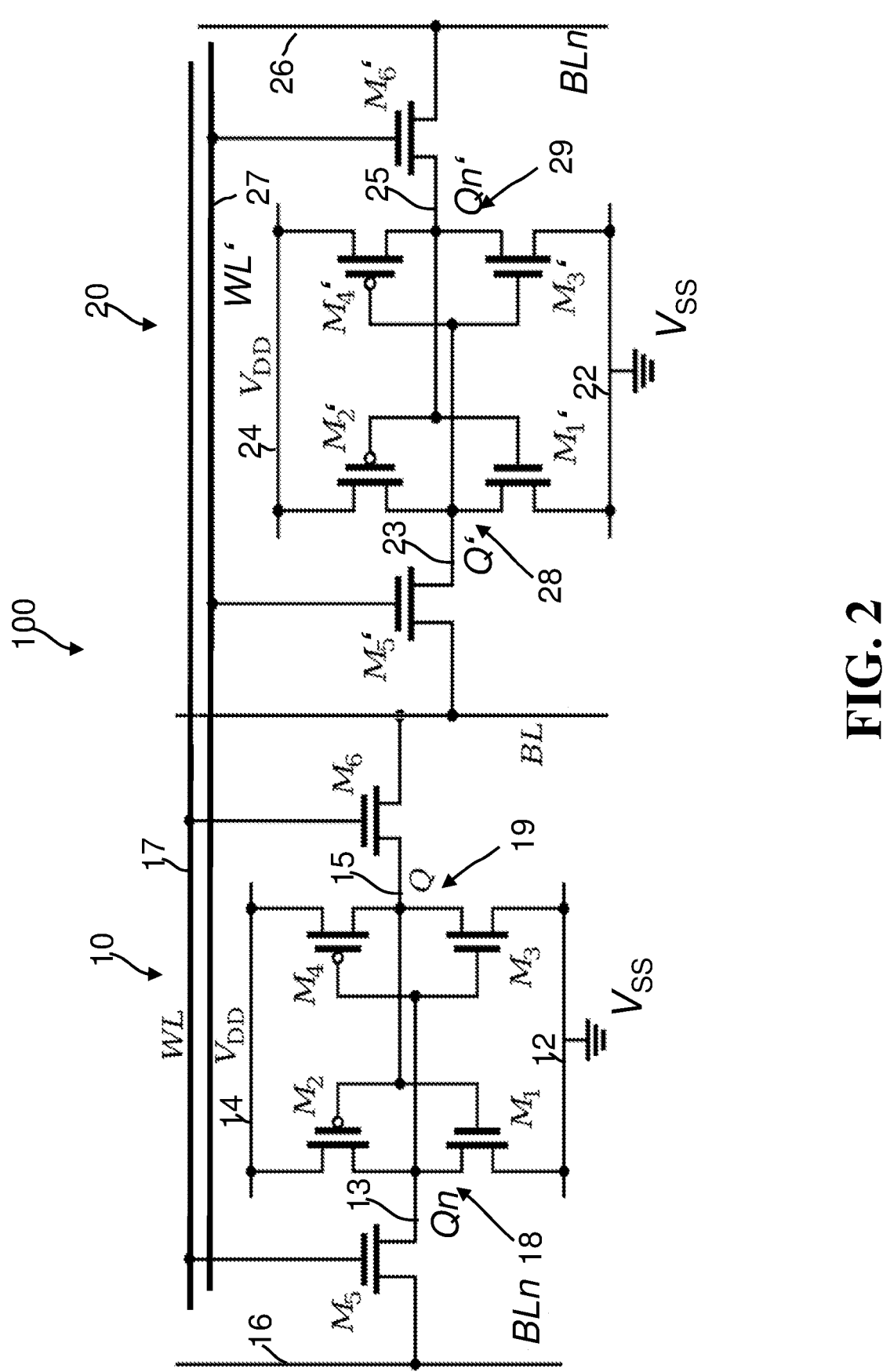
FIG. 2 depicts a circuit diagram of an example microelectronic device, in accordance with aspects of the present disclosure.
Figure 6:
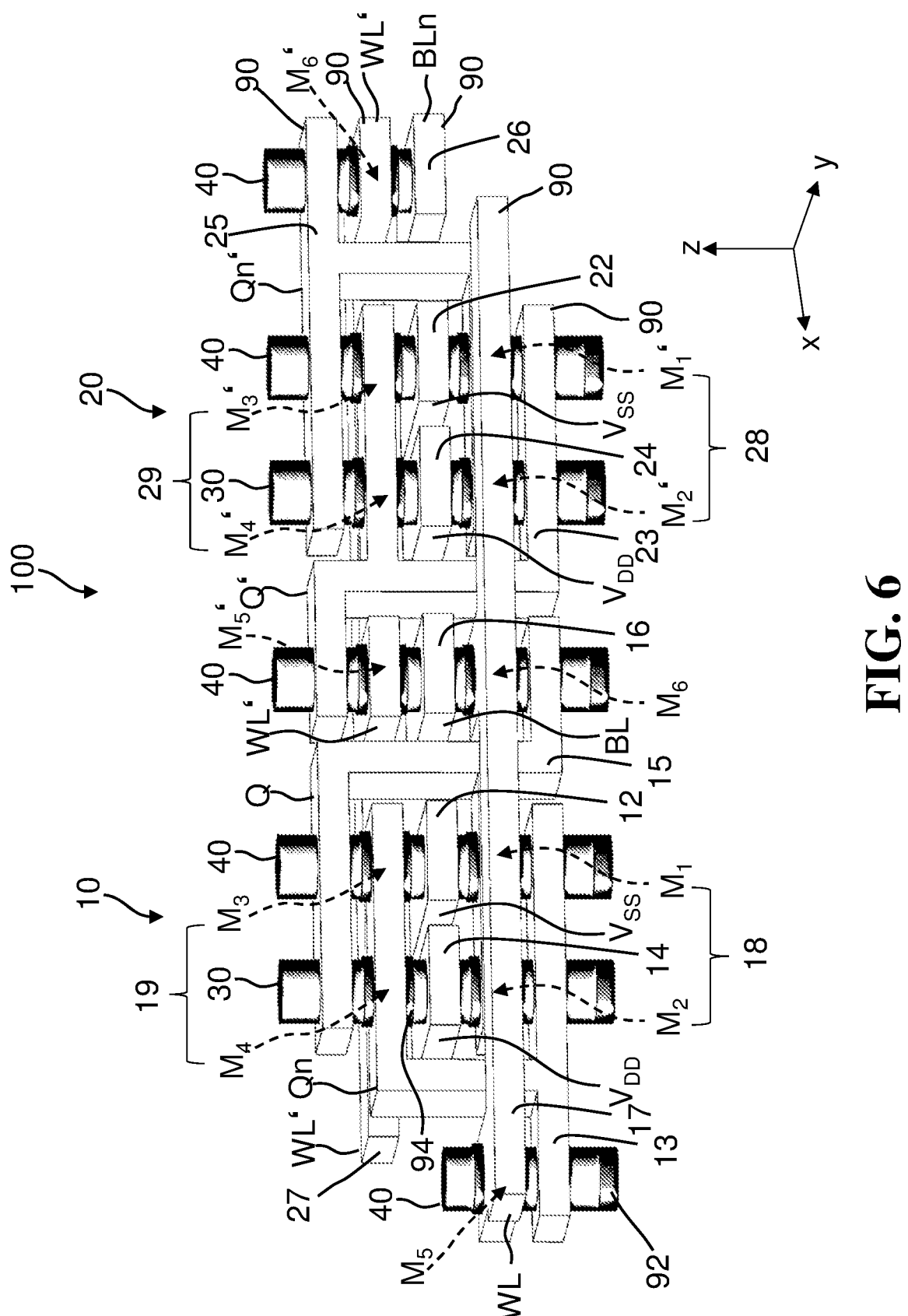
FIG. 6 depicts an isometric view of an example physical structure of a microelectronic device, in accordance with aspects of the present disclosure.

FIG. 2 depicts a circuit diagram of microelectronic device 100 comprising two SRAM memory cells 10, 20 (e.g., first memory cell and second memory cell) with six transistors referred to $M_1$, $M_2$, $M_3$, $M_4$, $M_5$, $M_6$, $M_1'$, $M_2'$, $M_3'$, $M_4'$, $M_5'$, $M_6'$, respectively. Each may share a common true bitline BL according to an embodiment of the invention. The principal structure of the two memory cells 10, 20 is the same as already described with FIG. 1. Nets 12, 13, 14, 15, 16, 17, 22, 23, 24, 25, 26, 27, as depicted in FIG. 1, may correspond to physical structures shown in FIG. 6, depicted for clarification.

The memory cell 20 comprises a first inverter 28 with a first transistor $M_1'$ and a second transistor $M_2'$ and a second inverter 29 with a first transistor $M_3'$ and a second transistor $M_4'$.

The transistors $M_5$, $M_6$ of the even cell 10 (e.g., first memory cell) may be connected to a wordline WL and the transistors $M_5'$, $M_6'$ of the odd cell 20 may be connected to a different wordline WL'. A drain of the transistor $M_5$ may be connected to the complement bitline BLn and a drain of the transistor $M_6'$ may be connected to another complement bitline BLn.

The two memory cells 10, 20 may be implemented as an even cell (e.g., first memory cell 10) and an odd cell (e.g., second memory cell 20). They may be connected at the common true bitline BL which may be connected to a transistor $M_6$ of the even cell 10 and to a transistor $M_5'$ of the odd cell 20. The connection of the two transistors $M_5'$, $M_6$ offers the possibility to stack the two memory cells 10, 20 onto each other in a three-dimensional structure of the microelectronic device 100.

Figure 3:
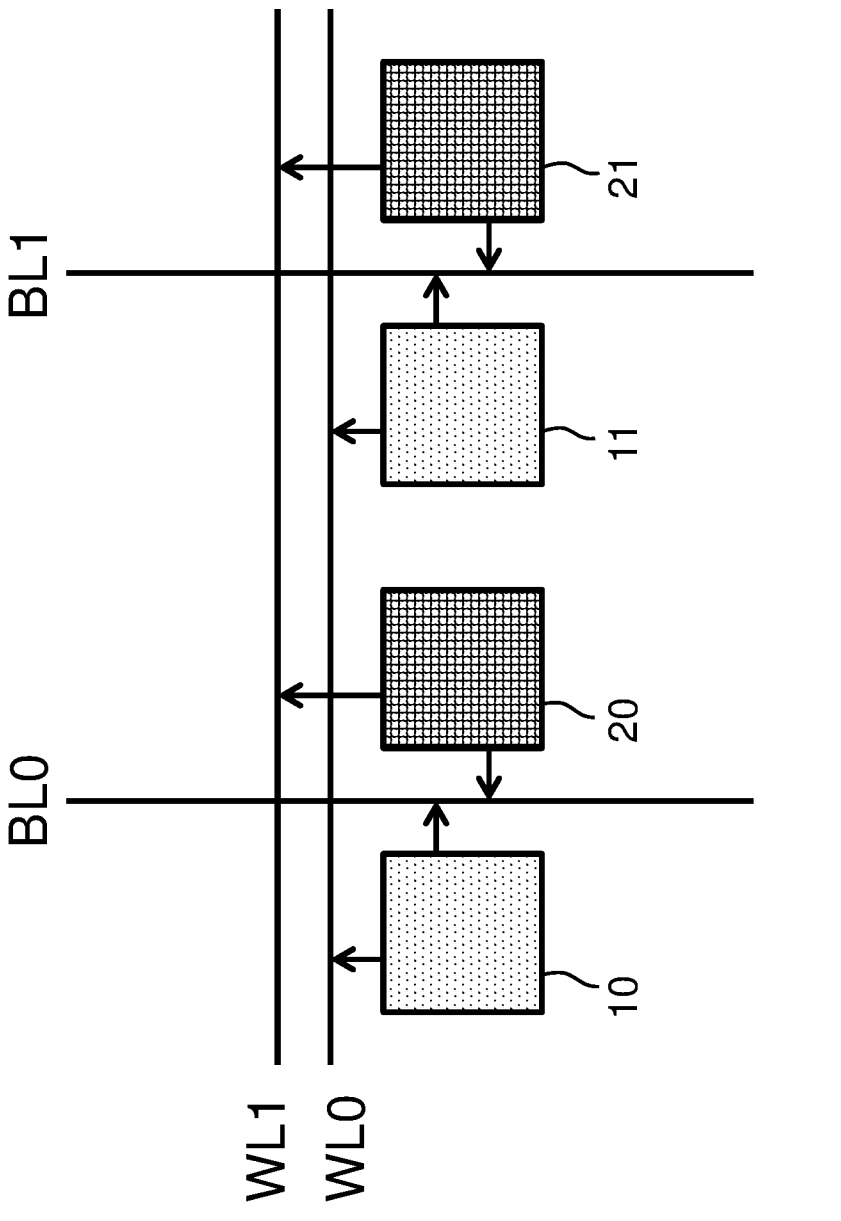
FIG. 3 depicts example schematics of memory cells in interleaving two rows sharing bitlines and wordlines, in accordance with aspects of the present disclosure.

FIG. 3 depicts schematics of memory cells 10, 11, 20, 21 in interleaving two rows sharing bitlines BL0, BL1 and wordlines WL0, WL1 according to an embodiment of the invention.

Advantageously the even memory cells 10, 11 may be connected to a single wordline WL0, whereas the odd memory cells 20, 21 may be connected to another single wordline WL1. The pairs of even and odd memory cells 10, 20 and 11, 21 may share a common bitline, BL0 and BL1 respectively.

Figure 4:
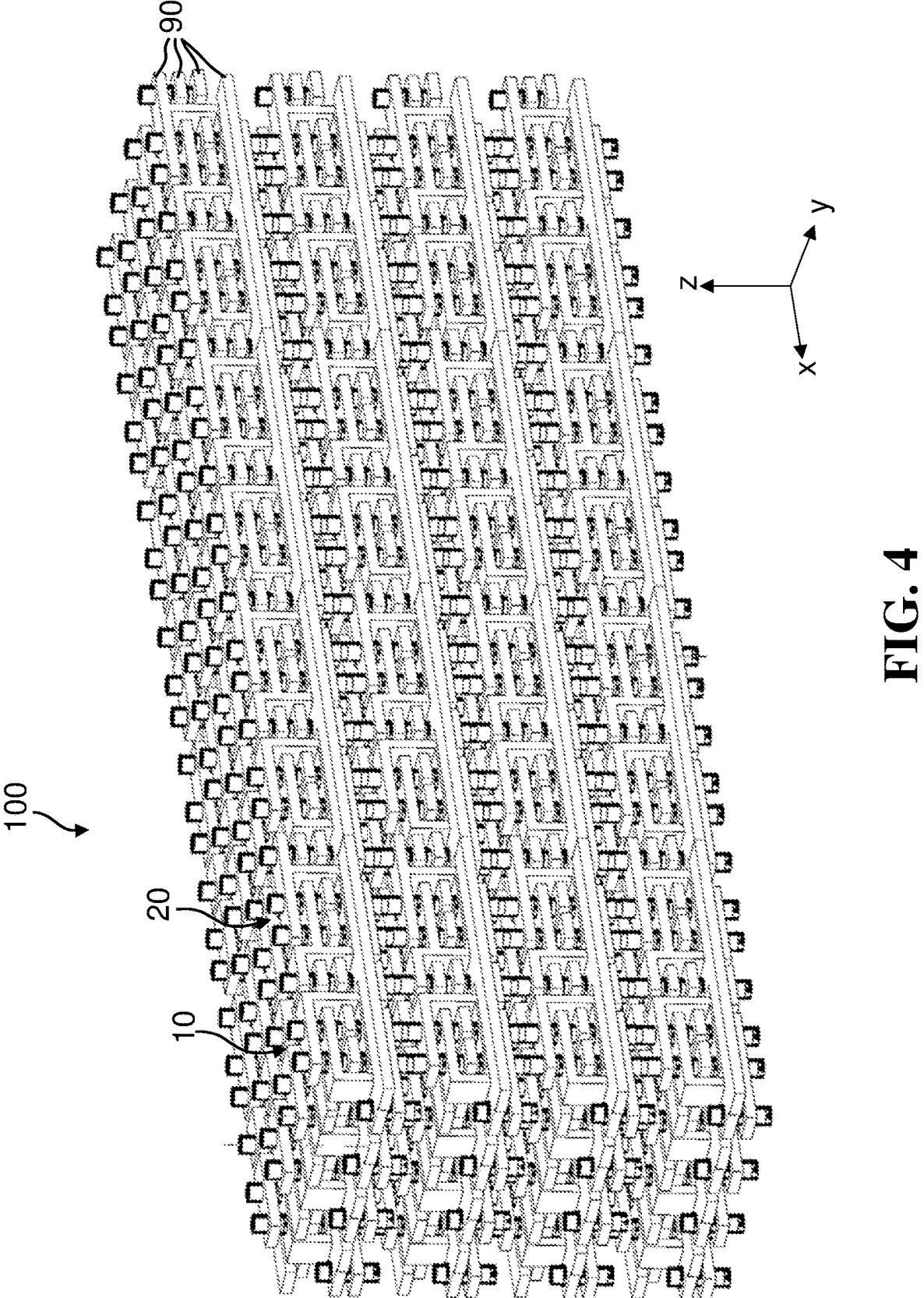
FIG. 4 depicts an example of a physical structure of a microelectronic device, in accordance with aspects of the present disclosure.

FIG. 4 depicts a physical structure of a microelectronic device 100 comprising three-dimensional stacking of memory cells 10, 20 according to an embodiment of the invention in an isometric view. A coordinate system in x-y-z-direction for the physical structure is defined.

The microelectronic device 100 may be implemented by a plurality of different conducting layers 90, where only the conducting layers 90 of a top layer of memory cells are referenced. Only two adjacent memory cells 10, 20 are marked which will be focused to in the following FIGS. 5 to 10.

Figure 5:
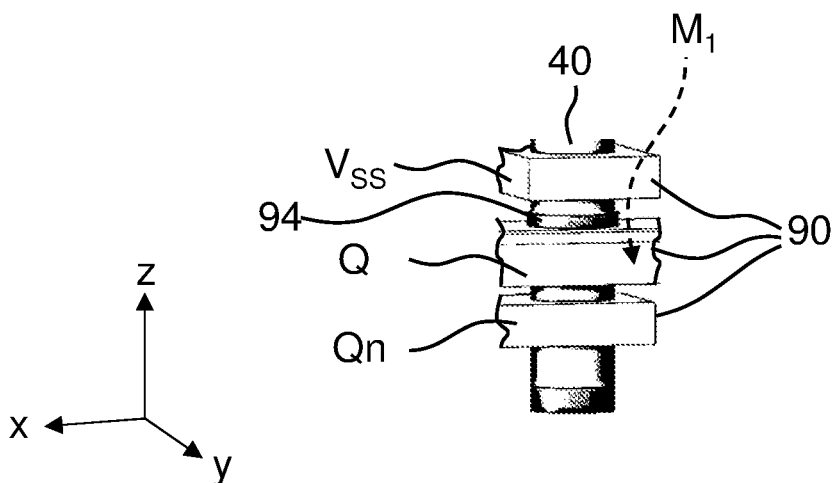
FIG. 5 depicts an isometric view of an example physical structure of a single transistor of the microelectronic device according to an embodiment of the invention in an isometric view, in accordance with aspects of the present disclosure.

FIG. 5 depicts a physical structure of a single transistor $M_1$ of the microelectronic device 100 according to an embodiment of the invention in an isometric view. This single transistor $M_1$ may be an example for just one element of the physical structure shown in FIG. 4.

The transistor $M_1$ may be implemented on a single vertical channel 40 of n-doped silicon. Conducting layers 90 may be wrapped around the vertical channel 40 and connected transverse to the channel 40 of the transistor $M_1$. The conducting layers 90 comprise a source electrode, that may be connected to a first power line $V_{ss}$, a gate electrode 94. The first power line $V_{ss}$, a gate electrode 94 may be connected to a true signal Q and a drain electrode. The drain electrode may be connected to a complement signal Qn.

The vertical channel regions may each be covered by a gate dielectric (e.g., a gate oxide). The gate dielectrics may be surrounded by the common gate electrode 94. This is depicted in FIG. 5 with the dark ring circling channel 40.

The channel 40 is depicted as a round column. The round column is often convenient for manufacturing silicon electrodes of a microelectronic device 100.

Figure 7:
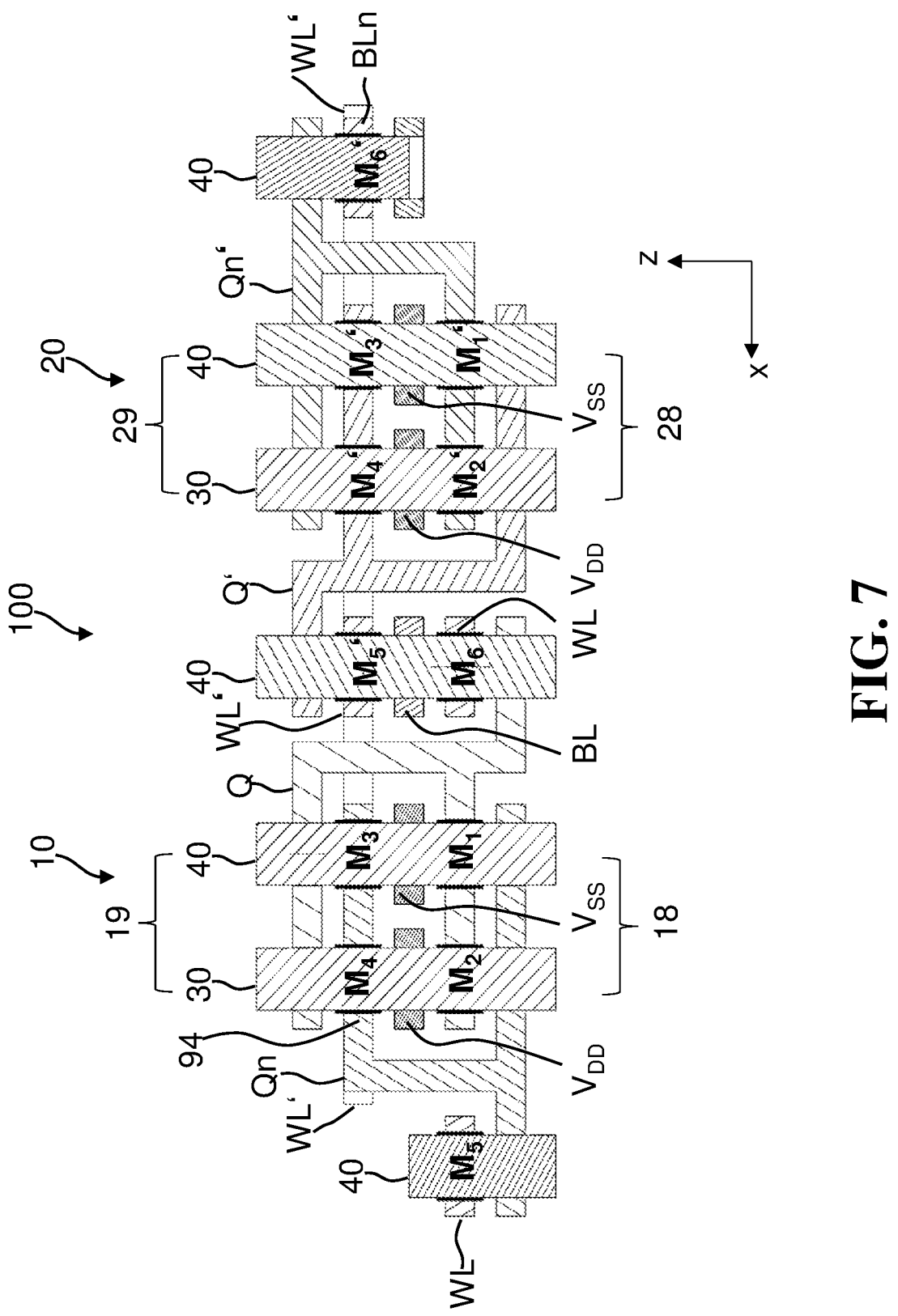
FIG. 7 depicts a cross-section view of an example microelectronic device, in accordance with aspects of the present disclosure.

FIG. 6 depicts an isometric view of a physical structure of a microelectronic device 100, such as the physical structure shown in FIG. 4. The isometric view of a physical structure of a microelectronic device 100 may comprise two memory cells 10, 20 with three-dimensional stacking of transistors $M_1$, $M_2$, $M_3$, $M_4$, $M_5$, $M_6$, $M_1'$, $M_2'$, $M_3'$, $M_4'$, $M_5'$, $M_6'$ according to an embodiment of the invention. FIG. 7 depicts a cross section of the microelectronic device 100 according to FIG. 6 in the x-z-plane. The cross section is cut in an x-z-plane at a y-value where the silicon channels 30, 40 of the physical structure are placed.

The net 17 is placed in front of the other parts. In some embodiments, there may be no connection between different nets 12, 13, 14, 15, 16, 17, 22, 23, 24, 25, 26, 27. In some embodiments, the different nets may be all placed apart from each other. In such embodiments, there may be a gap, such as the gap between the net 17 being in front and the net 13 being placed behind.

The silicon channels 30, 40 may exhibit an insulating layer 92, which is exemplarily marked at the left most channel 40, at a lower end of the depicted physical structure in FIG. 6 in order to separate different layers of memory cells 10, 20.

Gate electrodes 94 of the transistors $M_1$, $M_2$, $M_3$, $M_4$, $M_5$, $M_6$, $M_1'$, $M_2'$, $M_3'$, $M_4'$, $M_5'$, $M_6'$ are implemented on the silicon channels 30, 40 by wrapping dielectric layers, (e.g. a gate oxide), between the channels 30, 40 and the conduction nets 13, 15, 17, 23, 27, because the transistors $M_1$, $M_2$, $M_3$, $M_4$, $M_5$, $M_6$, $M_1'$, $M_2'$, $M_3'$, $M_4'$, $M_5'$, $M_6'$ are of a FET type. The gate electrode 94 may be only marked at one transistor $M_4$ for clarity. In FIG. 7 the gate electrode 94 may correspond to a dark line on both sides of the channels 30, 40.

The microelectronic device 100 may be implemented with a plurality of conducting layers 90, as depicted in FIG. 4. As may be seen in the figure, the conducting layers 90 may be mainly implemented as planar layers, but may also be routed vertically in order to be continued in another layer 90 further down or up. The transistors $M_1$, $M_2$, $M_3$, $M_4$, $M_5$, $M_6$, $M_1'$, $M_2'$, $M_3'$, $M_4'$, $M_5'$, $M_6'$ may also be contacted from different directions in a layer 90, in particular from directions perpendicular to one another.

The microelectronic device 100 further comprises the first memory cell 10 with at least six transistors $M_1$, $M_2$, $M_3$, $M_4$, $M_5$, $M_6$, and the second memory cell 20 with at least six transistors $M_1'$, $M_2'$, $M_3'$, $M_4'$, $M_5'$, $M_6'$.

The first pair of transistors $M_1$, $M_3$; $M_1'$, $M_3'$ of the first memory cell 10 and the second memory cell 20, respectively, may be stacked vertically and connected at a common net 12, 22. The common nets 12, 22 may be arranged transverse to the first pair of transistors $M_1$, $M_3$; $M_1'$, $M_3'$. Each transistor $M_1$, $M_1'$, $M_3$, $M_3'$ of the first pair of transistors $M_1$, $M_3$; $M_1'$, $M_3'$ may be of the same type (e.g., an N-FET), as they are implemented on the same channel 40 of e.g., n-doped silicon. The transistors $M_1$, $M_3$; $M_1'$, $M_3'$ of the first pair of transistors $M_1$, $M_3$; $M_1'$, $M_3'$ may share a first common power line $V_{ss}$, implemented as the common net 12, 22, respectively.

The second pair of transistors $M_2$, $M_4$; $M_2'$, $M_4'$ of the first memory cell 10 and the second memory cell 20, respectively, may be stacked vertically and connected at a common net 14, 24. The common nets 14, 24 are arranged transverse to the second pair of transistors $M_2$, $M_4$; $M_2'$, $M_4'$. Each transistor $M_2$, $M_2'$, $M_4$, $M_4'$ of the second pair of transistors $M_2$, $M_4$; $M_2'$, $M_4'$ may be of the same type, e.g., a P-FET, as they are implemented on the same channel 30 of e.g., p-doped silicon. The transistors $M_2$, $M_2'$, $M_4$, $M_4'$ of the second pair of transistors $M_2$, $M_4$; $M_2'$, $M_4'$ may be a different type than the first pair of transistors $M_1$, $M_3$; $M_1'$, $M_3'$. The transistors $M_2$, $M_4$; $M_2'$, $M_4'$ of the second pair of transistors $M_2$, $M_4$; $M_2'$, $M_4'$ share a second common power line $V_{dd}$, implemented as the common net 14, 24, respectively.

The transistors $M_1$, $M_1'$, $M_2$, $M_2'$, $M_3$, $M_3'$, $M_4$, $M_4'$ of the first and second pair of transistors $M_1$, $M_3$; $M_1'$, $M_3'$; $M_2$, $M_4$; $M_2'$, $M_4'$ may operate independently from each other.

The third pair of transistors $M_5'$, $M_6$ of the first and the second memory cell 10, 20 may be stacked vertically and connected at a common net 16, 26. The common net 16 may be arranged transverse to the third pair of transistors $M_5'$, $M_6$. Each transistor $M_5'$, $M_6$ of the third pair of transistors $M_5'$, $M_6$ may be of the same type, e.g., an N-FET, as they are implemented on the same channel 40 of e.g., n-doped silicon. The transistors $M_5'$, $M_6$ of the third pair of transistors $M_5'$, $M_6$ share a common true bit line BL, implemented as the common net 16.

As the two memory cells 10, 20 are part of a periodic structure of the microelectronic device 100 the third pair of transistors is in reality continued to either side of the microelectronic device 100 depicted in FIG. 6. That means, that the transistor $M_6'$ of the second memory cell 20 may be stacked on top of a transistor $M_5$ of a right hand sided adjacent, but not depicted first memory cell, and the transistor $M_5$ of the first memory cell 10 may be stacked below a transistor $M_6'$ of a left hand sided adjacent, but not depicted second memory cell, sharing a common complement bit line BLn, implemented as the common net 26.

Therefore, the transistors $M_5'$, $M_6$; $M_5$, $M_6'$ of the third pair of transistors $M_5'$, $M_6$; $M_5$, $M_6'$ of adjacent memory cells 10, 20 may be formed in different layers 90. Besides, the transistors $M_5'$, $M_6$; $M_5$, $M_6'$ of the third pair of transistors $M_5'$, $M_6$; $M_5$, $M_6'$ may be connected to different wordlines WL, WL'. The wordlines WL and WL' may be in different layers.

Thus, the first memory cell 10 and the second memory cell 20 may have at least six transistors $M_1$, $M_2$, $M_3$, $M_4$, $M_5$, $M_6$ and $M_1'$, $M_2'$, $M_3'$, $M_4'$, $M_5'$, $M_6'$ each, forming three stacks of stacked transistors $M_1$, $M_3$, $M_1'$, $M_3'$; $M_2$, $M_4$, $M_2'$, $M_4'$; $M_5'$, $M_6$, $M_5$, $M_6'$ per memory cell 10, 20.

The first transistors $M_1$, $M_1'$, $M_2$, $M_2'$, $M_5$, $M_5'$ of the first pair $M_1$, $M_3$; $M_1'$, $M_3'$, the second pair $M_2$, $M_4$; $M_2'$, $M_4'$ and the third pair of transistors $M_5'$, $M_6$; $M_5$, $M_6'$ share one common net 13, 23 and may be connected to a complement signal Qn in the first memory cell 10 and to a true signal Q' in the second memory cell 20.

The second transistors $M_3$, $M_3'$, $M_4$, $M_4'$, $M_6$, $M_6'$ of the first pair $M_1$, $M_3$; $M_1'$, $M_3'$, the second pair $M_2$, $M_4$; $M_2'$, $M_4'$ and the third pair of transistors $M_5'$, $M_6$, $M_5$, $M_6'$ may share another net 15, 25 and may be connected to a true signal Q in the first memory cell 10 and to a complement signal Qn' in the second memory cell 20.

A first inverter 18, 28 as defined in FIG. 2, comprises the first transistor $M_1$, $M_1'$ of the first pair of transistors $M_1$, $M_3$; $M_1'$, $M_3'$ and the first transistor $M_2$, $M_2'$ of the second pair of transistors $M_2$, $M_4$; $M_2'$, $M_4'$. A second inverter 19, 29 comprises the second transistor $M_3$, $M_3'$ of the first pair of transistors $M_1$, $M_3$; $M_1'$, $M_3'$ and the second transistor $M_4$, $M_4'$ of the second pair of transistors $M_2$, $M_4$; $M_2'$, $M_4'$.

The first inverter 18 and the second inverter 19 may be cross coupled.

The first inverter 18 may invert a true signal Q and drives a complement signal Qn, the second inverter 19 inverts a complement signal Qn and drives a true signal Q.

The depicted microelectronic device 100 as depicted in the Figures may be manufactured according to the proposed method of forming a microelectronic device 100 comprising a plurality of conducting layers 90, the method comprising: forming a first power line $V_{ss}$; forming a second power line $V_{dd}$; forming a first memory cell 10 with at least six transistors $M_1$, $M_2$, $M_3$, $M_4$, $M_5$, $M_6$; forming a second memory cell 20 with at least six transistors $M_1'$, $M_3'$, $M_4'$, $M_5'$, $M_6'$.

Figure 8:
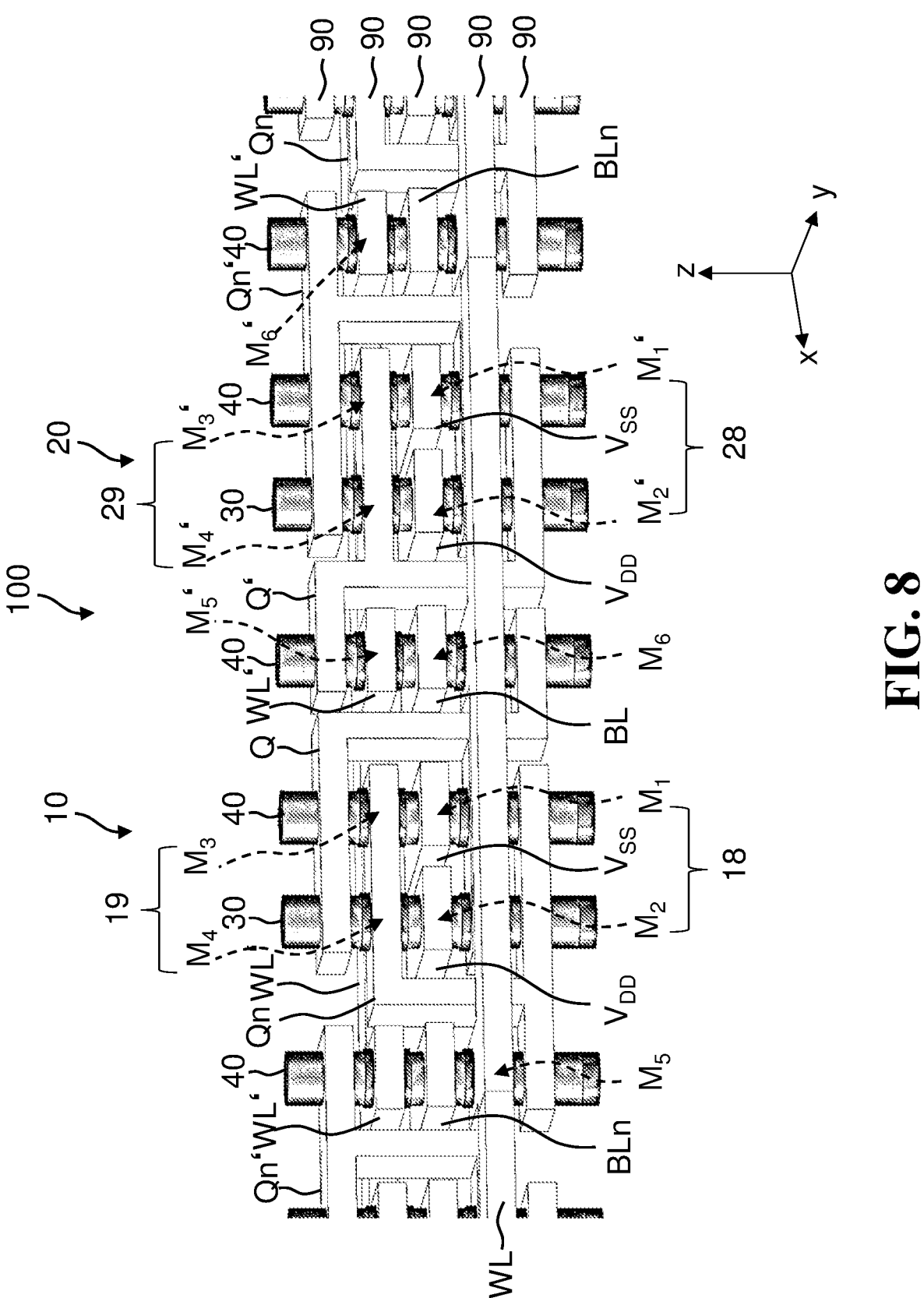
FIG. 8 depicts an example of a microelectronic device with the two memory cells, in accordance with aspects of the present disclosure.

FIG. 8 depicts the microelectronic device 100 with the two memory cells 10, 20 according to FIG. 6 embedded in adjacent memory cells of the physical structure in an isometric view. This may be a concurrent follow up of memory cells 10, 20 in one of the horizontal direction x.

Figure 9:
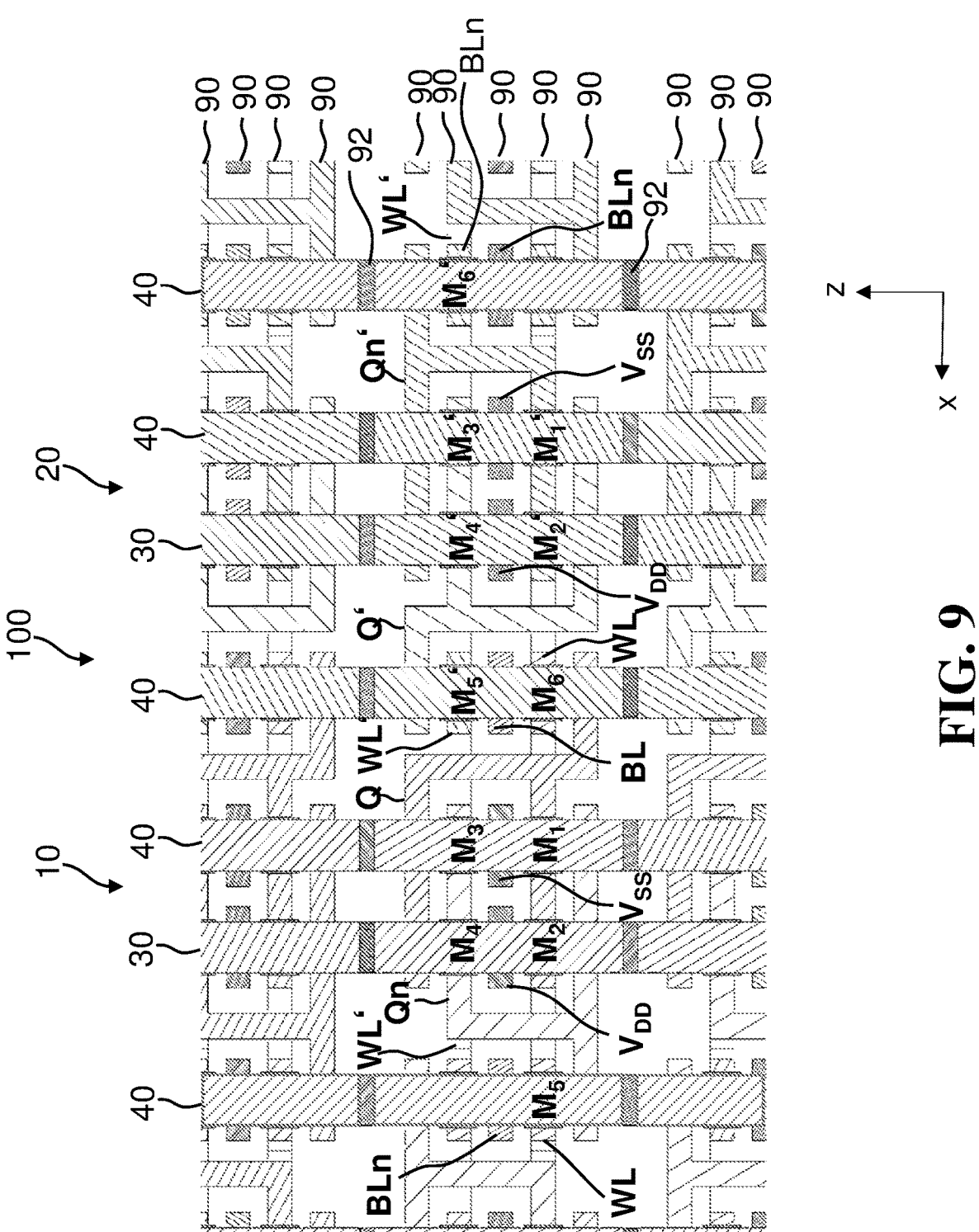
FIG. 9 depicts a cross-section of an example microelectronic device, in accordance with aspects of the present disclosure.

FIG. 9 depicts a cross section of the microelectronic device 100 according to FIG. 8 in the x-z-plane, where a further concurrent follow up of the memory cells 10, 20 can be seen, in a vertical direction z, as depicted in the big physical structure in FIG. 4.

In the embodiments shown in the FIGS. 8 and 9 a number of additional conducting layers 90 are depicted, implementing additional memory cells which are adjacent and connected to the two memory cells 10, 20 described in FIGS. 6 and 7. Thus an integrated circuit comprising a plurality of microelectronic devices 100 with two memory cells 10, 20 may be implemented. Between different layers of memory cells 10, 20 in the z-direction insulating layers 92 are implemented, depicted as dark regions in FIG. 9, interrupting the silicon channels 30, 40 in the z-direction in order to separate different layers of memory cells 10, 20.

Figure 10:
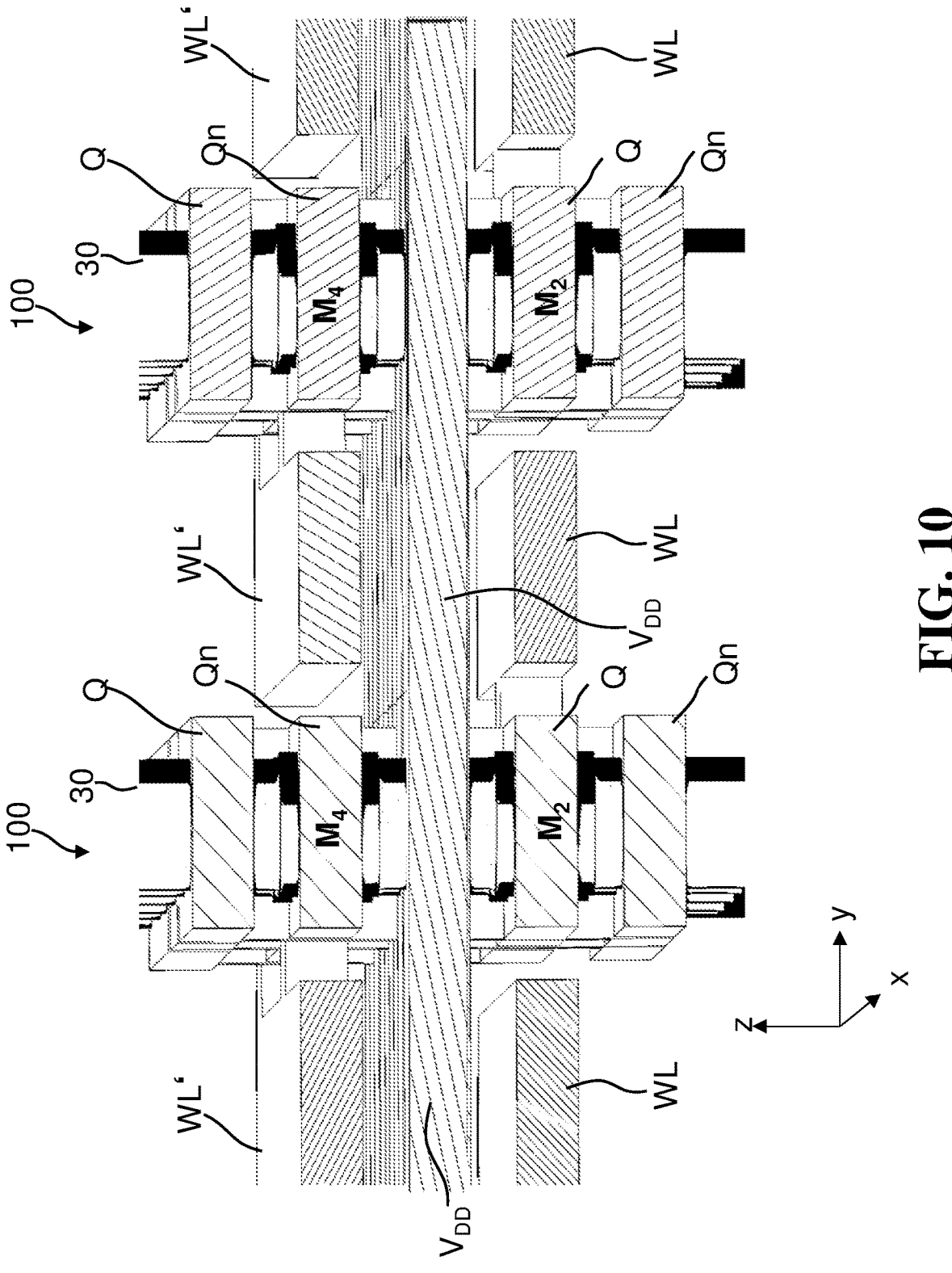
FIG. 10 depicts an example physical structure of the microelectronic device, in accordance with aspects of the present disclosure.

FIG. 10 depicts the physical structure of the microelectronic device 100 comprising two memory cells 10, 20 according to FIG. 8 in an isometric view cut in the y-z-plane.

In this embodiment, the cross section second pairs of transistors $M_2$, $M_4$ stacked on channels 30 may be side by side. The pairs of transistors $M_2$, $M_4$ may be connected to the second power line $V_{dd}$. The second power lines $V_{dd}$ may run uninterrupted from side to side in the y-direction. In the cross section, the word lines WL as well as the word lines WL' may be cut as they are routed in the x-direction perpendicular to the y-z-plane of the FIG. 10.

In x-direction behind the silicon channels 30 with the second pairs of transistors $M_2$, $M_4$ silicon channels 40 with first pairs of transistors $M_1$, $M_2$ may be placed by an other pair of second transistors in alternated rows.

The described microelectronic device 100 as depicted in the Figures may be manufactured according to the provided method of forming a microelectronic device 100 comprising a plurality of conducting layers 90, the method comprising: a processor forming a first power line V Ss; a processor forming a second power line V dd; a processor forming a first memory cell 10 with at least six transistors $M_1$, $M_2$, $M_3$, $M_4$, $M_5$, $M_6$; a processor forming a second memory cell 20 with at least six transistors $M_1'$, $M_2'$, $M_3'$, $M_4'$, $M_5'$, $M_6'$.

A first pair of transistors $M_1$, $M_3$; $M_1'$, $M_3'$ of the first memory cell 10 may be stacked vertically and connected at a common net 12, 22, in particular connected at a common net 12, 22 arranged transverse to the first pair of transistors $M_1$, $M_3$; $M_1'$, $M_3'$. Each transistor $M_1$, $M_1'$, $M_3$, $M_3'$ of the first pair of transistors $M_1$, $M_3$; $M_1'$, $M_3'$ may be of the same type, and wherein the first pair of transistors $M_1$, $M_3$; $M_1'$, $M_3'$ shares the first common power line $V_{ss}$.

A second pair of transistors $M_2$, $M_4$; $M_2'$, $M_4'$ of the first memory cell 10 is stacked vertically and connected at a common net 14, 24, arranged transverse to the second pair of transistors $M_2$, $M_4$; $M_2'$, $M_4'$. Each transistor $M_2$, $M_2'$, $M_4$, $M_4'$ of the second pair of transistors $M_2$, $M_4$; $M_2'$, $M_4'$ may be of the same type, and being a different type than the first pair of transistors $M_1$, $M_3$; $M_1'$, $M_3'$. The second pair of transistors $M_2$, $M_4$; $M_2'$, $M_4'$ may share the second common power line $V_{dd}$.

The transistors $M_1$, $M_1'$, $M_2$, $M_2'$, $M_3$, $M_3'$, $M_4$, $M_4'$ of the first and second pair of transistors $M_1$, $M_3$; $M_1'$, $M_3'$; $M_2$, $M_4$; $M_2'$, $M_4'$ may be operating independently from each other.

A third pair of transistors $M_5'$, $M_6$; $M_5$, $M_6'$ of the second and the first memory cell 10 may be stacked vertically and connected at a common net 16, 26, in particular connected at a common net 16, 26 arranged transverse to the third pair of transistors $M_5$, $M_6$; $M_5$, $M_6'$. Each transistor $M_5$, $M_5'$, $M_6$, $M_6'$ of the third pair of transistors $M_5'$, $M_6$; $M_5$, $M_6'$ is of the same type. The third pair of transistors $M_5'$, $M_6$; $M_5$, $M_6'$ shares a common bit line BL, BLn.

Standard processes of semiconductor manufacturing may be used, building up layer by layer. Thus, the transistors $M_1$, $M_1'$, $M_2$, $M_2'$, $M_3$, $M_3'$, $M_4$, $M_4'$, $M_5'$, $M_6$, $M_5$, $M_6'$ as well as all the power lines $V_{ss}$, $V_{DD}$ and connecting nets 12, 13, 14, 15, 16, 17, 22, 23, 24, 25, 26, 27 may be built in parallel in the x-y-plane of the physical structure of the microelectronic device 100.

Further exemplary embodiments of the present disclosure are set out in the following numbered clauses:

In some embodiments, a microelectronic device 100 comprising a plurality of conducting layers 90. The microelectronic device 100 may comprise a first memory cell 10 with at least six transistors (e.g., $M_1$, $M_2$, $M_3$, $M_4$, $M_5$, $M_6$), a second memory cell 20 with at least six transistors (e.g., $M_1'$, $M_3'$, $M_4'$, $M_5'$, $M_6'$). The first pair of transistors (e.g., $M_1$, $M_3$; $M_1'$, $M_3'$) of the first memory cell 10 may be stacked vertically and connected at a common net 12, 22, arranged transverse to the first pair of transistors (e.g., $M_1$, $M_3$; $M_1'$, $M_3'$). Each transistor (e.g., $M_1$, $M_1'$, $M_3$, $M_3'$) of the first pair of transistors (e.g., $M_1$, $M_3$; $M_1'$, $M_3'$) may be of the same type. The first pair of transistors (e.g., $M_1$, $M_3$; $M_1'$, $M_3'$) may share a first common power line ($V_{ss}$). A second pair of transistors (e.g., $M_2$, $M_4$; $M_2'$, $M_4'$) of the first memory cell 10 may be stacked vertically and connected at a common net 14, 24, arranged transverse to the second pair of transistors (e.g., $M_2$, $M_4$; $M_2'$, $M_4'$). Each transistor (e.g., $M_2$, $M_2'$, $M_4$, $M_4'$) of the second pair of transistors (e.g., $M_2$, $M_4$; $M_2'$, $M_4'$) is of the same type, and being a different type than the first pair of transistors (e.g., $M_1$, $M_3$; $M_1'$, $M_3'$), wherein the second pair of transistors (e.g., $M_2$, $M_4$; $M_2'$, $M_4'$) shares a second common power line ($V_{dd}$), wherein the transistors (e.g., $M_1$, $M_1'$, $M_2$, $M_2'$, $M_3$, $M_3'$, $M_4$, $M_4'$) of the first and second pair of transistors (e.g., $M_1$, $M_3$; $M_1'$, $M_3'$; $M_2$, $M_4$; $M_2'$, $M_4'$) are operating independently from each other.

In some embodiments, the microelectronic device may include a third pair of transistors (e.g., $M_5'$, $M_6$; $M_5$, $M_6'$) of the first and the second memory cell 10, 20 may be stacked vertically and connected at a common net 16, 26, arranged transverse to the third pair of transistors (e.g., $M_5'$, $M_6$; $M_5$, $M_6'$). Each transistor (e.g., $M_5$, $M_5'$, $M_6$, $M_6'$) of the third pair of transistors (e.g., $M_5'$, $M_6$; $M_5$, $M_6'$) may be of the same type. The third pair of transistors (e.g., $M_5'$, $M_6$; $M_5$, $M_6'$) may share a common bit line (e.g., BL and/or BLn).

In some embodiments, the microelectronic device may further include first memory cell 10 and the second memory cell 20. The memory cell 10 and the second memory cell 20 may each have at least six transistors (e.g., $M_1$, $M_2$, $M_3$, $M_4$, $M_5$, $M_6$) and (e.g., $M_1'$, $M_2'$, $M_3'$, $M_4'$, $M_5'$, $M_6'$). In some embodiments, three stacks of stacked transistors (e.g., $M_1$, $M_3$, $M_1'$, $M_3'$; $M_2$, $M_4$, $M_2'$, $M_4'$; $M_5'$, $M_6$, $M_5$, $M_6'$) may be formed in each memory cell 10, 20.

In some embodiments, the microelectronic device may further include a first inverter 18, 28 comprises a first transistor (e.g., $M_1$, $M_1'$) of the first pair of transistors (e.g., $M_1$, $M_3$; $M_1'$, $M_3'$) and a first transistor (e.g., $M_2$, $M_2'$) of the second pair of transistors (e.g., $M_2$, $M_4$; $M_2'$, $M_4'$). In some embodiments, a second inverter 19, 29 may comprise a second transistor (e.g., $M_3$, $M_3'$) of the first pair of transistors (e.g., $M_1$, $M_3$; $M_1'$, $M_3'$) and a second transistor (e.g., $M_4$, $M_4'$) of the second pair of transistors (e.g., $M_2$, $M_4$; $M_2'$, $M_4'$).

In some embodiments, the microelectronic device may further include the first inverter 18, 28 cross coupled to the second inverter 19, 29.

In some embodiments, the microelectronic device may further include the first inverter 18, 28 inverting a true signal (e.g., Q) and driving a complement signal (e.g., Qn). The second inverter 19, 29 may invert a complement signal (e.g., Qn) and drive a true signal (e.g., Q).

In some embodiments, the third pair of transistors (e.g., $M_5'$, $M_6$; $M_5$, $M_6'$) may be connected to a true bitline (e.g., BL) or to a complement bitline (e.g., BLn).

In some embodiments, the microelectronic device may further include the first transistors (e.g., $M_1$, $M_1'$, $M_2$, $M_2'$, $M_5$, $M_5'$) of the first pair (e.g., $M_1$, $M_3$; $M_1'$, $M_3'$), the second pair (e.g., $M_2$, $M_4$; $M_2'$, $M_4'$) and the third pair of transistors (e.g., $M_5'$, $M_6$; $M_5$, $M_6'$) share one net and are connected to a complement signal (e.g., Qn) in the first memory cell 10 and to a true signal (e.g., Q') in the second memory cell 20, wherein the second transistors (e.g., $M_3$, $M_3'$, $M_4$, $M_4'$, $M_6$, $M_6'$) of the first pair (e.g., $M_1$, $M_3$; $M_1'$, $M_3'$), the second pair (e.g., $M_2$, $M_4$; $M_2'$, $M_4'$) and the third pair of transistors (e.g., $M_5'$, $M_6$; $M_5$, $M_6'$) share another net and are connected to a true signal (e.g., Q) in the first memory cell 10 and to a complement signal (e.g., Qn') in the second memory cell 20.

In some embodiments, the transistors (e.g., $M_5'$, $M_6$; $M_5$, $M_6'$) of the third pair of transistors (e.g., $M_5'$, $M_6$; $M_5$, $M_6'$) of adjacent memory cells 10, 20 may be formed in different layers 90.

In some embodiments, the transistors (e.g., $M_5'$, $M_6$; $M_5$, $M_6'$) of the third pair of transistors (e.g., $M_5'$, $M_6$; $M_5$, $M_6'$) may be connected to different wordlines (e.g., WL, WL').

In some embodiments, the microelectronic device may include a plurality of conducting layers (90). A method of forming a microelectronic device may include: forming a first power line (e.g., $V_{ss}$); forming a second power line (e.g., $V_{dd}$); forming a first memory cell 10 with at least six transistors (e.g., $M_1$, $M_2$, $M_3$, $M_4$, $M_5$, $M_6$); forming a second memory cell 20 with at least six transistors (e.g., $M_1'$, $M_2'$, $M_3'$, $M_4'$, $M_5'$, $M_6'$). A first pair of transistors (e.g., $M_1$, $M_3$; $M_1'$, $M_3'$) of the first memory cell 10 may be stacked vertically and connected at a common net 12, 22, arranged transverse to the first pair of transistors (e.g., $M_1$, $M_3$; $M_1'$, $M_3'$). Each transistor (e.g., $M_1$, $M_1'$, $M_3$, $M_3'$) of the first pair of transistors (e.g., $M_1$, $M_3$; $M_1'$, $M_3'$) may be of the same type. The first pair of transistors (e.g., $M_1$, $M_3$; $M_1'$, $M_3'$) may share the first common power line (e.g., $V_{ss}$). A second pair of transistors (e.g., $M_2$, $M_4$; $M_2'$, $M_4'$) of the first memory cell 10 may be stacked vertically and connected at a common net 14, 24, arranged transverse to the second pair of transistors (e.g., $M_2$, $M_4$; $M_2'$, $M_4'$). Each transistor (e.g., $M_2$, $M_2'$, $M_4$, $M_4'$) of the second pair of transistors (e.g., $M_2$, $M_4$; $M_2'$, $M_4'$) may be of the same type and may be a different type than the first pair of transistors (e.g., $M_1$, $M_3$; $M_1'$, $M_3'$). The second pair of transistors (e.g., $M_2$, $M_4$; $M_2'$, $M_4'$) may share the second common power line (e.g., $V_{dd}$). The transistors (e.g., $M_1$, $M_1'$, $M_2$, $M_2'$, $M_3$, $M_3'$, $M_4$, $M_4'$) of the first and second pair of transistors (e.g., $M_1$, $M_3$; $M_1'$, $M_3'$; $M_2$, $M_4$; $M_2'$, $M_4'$) may operate independently from each other.

In some embodiments, the microelectronic device may include a third pair of transistors (e.g., $M_5'$, $M_6$; $M_5$, $M_6'$) associated with the second and the first memory cell 10 may be stacked vertically and connected at a common net 16, 26, arranged transverse to the third pair of transistors (e.g., $M_5'$, $M_6$; $M_5$, $M_6'$). Each transistor (e.g., $M_5$, $M_5'$, $M_6$, $M_6'$) of the third pair of transistors (e.g., $M_5'$, $M_6$; $M_5$, $M_6'$) is of the same type. The third pair of transistors (e.g., $M_5'$, $M_6$; $M_5$, $M_6'$) may share a common bit line (e.g., BL, BLn).

In some embodiments, the microelectronic device may include a second memory cell 20 having at least six transistors (e.g., $M_1$, $M_2$, $M_3$, $M_4$, $M_5$, $M_6$) and (e.g., $M_1'$, $M_2'$, $M_3'$, $M_4'$, $M_5'$, $M_6'$). Each of the at least six transistors may form three stacks of stacked transistors (e.g., $M_1$, $M_3$, $M_1'$, $M_3'$; $M_2$, $M_4$, $M_2'$, $M_4'$; $M_5'$, $M_6$) for each memory cell 10, 20.

In some embodiments, the microelectronic device may include a first inverter 18, 28. The first inverter 18, 28 may include a first transistor (e.g., $M_1$, $M_1'$) of the first pair of transistors (e.g., $M_1$, $M_3$; $M_1'$, $M_3'$) and a first transistor (e.g., $M_2$, $M_2'$) of the second pair of transistors (e.g., $M_2$, $M_4$; $M_2'$, $M_4'$). A second inverter 19, 29 may be formed comprising a second transistor (e.g., $M_3$, $M_3'$) of the first pair of transistors (e.g., $M_1$, $M_3$; $M_1'$, $M_3'$) and a second transistor (e.g., $M_4$, $M_4'$) of the second pair of transistors (e.g., $M_2$, $M_4$; $M_2'$, $M_4'$).

In some embodiments, the microelectronic device may have the first inverter 18, 28 cross coupled to the second inverter 19, 29.

In some embodiments, the microelectronic device may include the first inverter 18, 28. The first inverter may invert a true signal (e.g., Q) and drives a complement signal (e.g., Qn). The second inverter 19, 29 may be formed by inverting a complement signal (e.g., Qn) and driving a true signal (e.g., Q).

In some embodiments, the microelectronic device may include a third pair of transistors (e.g., $M_5'$, $M_6$; $M_5$, $M_6'$) that may be connected to a true bitline (e.g., BL) or to a complement bitline (e.g., BLn).

In some embodiments, the microelectronic device may include the first transistors (e.g., $M_1$, $M_1'$, $M_2$, $M_2'$, $M_5$, $M_5'$) of the first pair (e.g., $M_1$, $M_3$; $M_1'$, $M_3'$), the second pair (e.g., $M_2$, $M_4$; $M_2'$, $M_4'$), and the third pair of transistors (e.g., $M_5'$, $M_6$; $M_5$, $M_6'$). The first pair, second pair, and third pair of transistors may be formed by sharing one net and may be connected to a complement signal (e.g., Qn) in the first memory cell 10 and to a true signal (e.g., Q') in the second memory cell 20. The second transistors (e.g., $M_3$, $M_3'$, $M_4$, $M_4'$, $M_6$, $M_6'$) of the first pair (e.g., $M_1$, $M_3$; $M_1'$, $M_3'$) and the second pair (e.g., $M_2$, $M_4$; $M_2'$, $M_4'$) and the third pair of transistors (e.g., $M_5'$, $M_6$; $M_5$, $M_6'$) may be formed by sharing another net and may be connected to true signal (e.g., Q) in the first memory cell 10 and to a complement signal (e.g., Qn') in the second memory cell 20.

In some embodiments, the microelectronic device may include transistors (e.g., $M_5$, $M_5'$, $M_6$, $M_6'$) of the third pair of transistors (e.g., $M_5'$, $M_6$; $M_5$, $M_6'$) of adjacent memory cells 10, 20 may be formed in different layers 90.

In some embodiments, the microelectronic device may include transistors (e.g., $M_5$, $M_5'$, $M_6$, $M_6'$) of the third pair of transistors (e.g., $M_5'$, $M_6$; $M_5$, $M_6'$) that may be connected to different wordlines (e.g., WL, WL').

In an alternative embodiment, the microelectronic device may include a first memory cell 10 with at least six transistors (e.g., $M_1$, $M_2$, $M_3$, $M_4$, $M_5$, $M_6$) and a second memory cell 20 with at least six transistors (e.g., $M_1'$, $M_2'$, $M_3'$, $M_4'$, $M_5'$, $M_6'$). In some embodiments, a first pair of transistors (e.g., $M_1$, $M_3$; $M_1'$, $M_3'$) of the first memory cell 10 may be stacked vertically and connected at a common net 12, 22, arranged transverse to the first pair of transistors (e.g., $M_1$, $M_3$; $M_1'$, $M_3'$). Each transistor (e.g., $M_1$, $M_1'$, $M_3$, $M_3'$) of the first pair of transistors (e.g., $M_1$, $M_3$; $M_1'$, $M_3'$) may be of the same type. In some embodiments, the first pair of transistors (e.g., $M_1$, $M_3$; $M_1'$, $M_3'$) may share a first common power line (e.g., $V_{ss}$). A second pair of transistors (e.g., $M_2$, $M_4$; $M_2'$, $M_4'$) of the first memory cell 10 may be stacked vertically and connected at a common net 14, 24, arranged transverse to the second pair of transistors (e.g., $M_2$, $M_4$; $M_2'$, $M_4'$). Each transistor (e.g., $M_2$, $M_2'$, $M_4$, $M_4'$) of the second pair of transistors (e.g., $M_2$, $M_4$; $M_2'$, $M_4'$) may be of the same type, and may be a different type than the first pair of transistors (e.g., $M_1$, $M_3$; $M_1'$, $M_3'$). The second pair of transistors (e.g., $M_2$, $M_4$; $M_2'$, $M_4'$) may share a second common power line ($V_{dd}$). The transistors (e.g., $M_1$, $M_1'$, $M_2$, $M_2'$, $M_3$, $M_3'$, $M_4$, $M_4'$) of the first and second pair of transistors (e.g., $M_1$, $M_3$; $M_1'$, $M_3'$; $M_2$, $M_4$; $M_2'$, $M_4'$) may be operated independently from each other. A third pair of transistors (e.g., $M_5'$, $M_6$; $M_5$, $M_6'$) of the first and the second memory cell 10, 20 may be stacked vertically and connected at a common net 16, 26, arranged transverse to the third pair of transistors (e.g., $M_5'$, $M_6$; $M_5$, $M_6'$). Each transistor (e.g., $M_5$, $M_5'$, $M_6$, $M_6'$) of the third pair of transistors (e.g., $M_5'$, $M_6$; $M_5$, $M_6'$) may be of the same type. In some embodiments, the third pair of transistors (e.g., $M_5'$, $M_6$; $M_5$, $M_6'$) may share a common bit line (e.g., BL, BLn).

In some embodiments, the microelectronic device may include forming a first power line (e.g., $V_{ss}$), forming a second power line (e.g., $V_{dd}$), forming a first memory cell 10 with at least six transistors (e.g., $M_1$, $M_2$, $M_3$, $M_4$, $M_5$, $M_6$), and forming a second memory cell 20 with at least six transistors (e.g., $M_1'$, $M_2'$, $M_3'$, $M_4'$, $M_5'$, $M_6'$). In some embodiments, a first pair of transistors (e.g., $M_1$, $M_3$; $M_1'$, $M_3'$) of the first memory cell 10 may be stacked vertically and connected at a common net 12, 22, arranged transverse to the first pair of transistors (e.g., $M_1$, $M_3$; $M_1'$, $M_3'$). Each transistor (e.g., $M_1$, $M_1'$, $M_3$, $M_3'$) of the first pair of transistors (e.g., $M_1$, $M_3$; $M_1'$, $M_3'$) may be of the same type of transistor. The first pair of transistors (e.g., $M_1$, $M_3$; $M_1'$, $M_3'$) may share the first common power line (e.g., $V_{ss}$). A second pair of transistors (e.g., $M_2$, $M_4$; $M_2'$, $M_4'$) of the first memory cell 10 may be stacked vertically and connected at a common net 14, 24, arranged transverse to the second pair of transistors (e.g., $M_2$, $M_4$; $M_2'$, $M_4'$). In some embodiments, each transistor (e.g., $M_2$, $M_2'$, $M_4$, $M_4'$) of the second pair of transistors (e.g., $M_2$, $M_4$; $M_2'$, $M_4'$) may be of the same type, and may be a different type than the first pair of transistors (e.g., $M_1$, $M_3$; $M_1'$, $M_3'$). The second pair of transistors (e.g., $M_2$, $M_4$; $M_2'$, $M_4'$) may share the second common power line (e.g., $V_{dd}$). The transistors (e.g., $M_1$, $M_1'$, $M_2$, $M_2'$, $M_3$, $M_3'$, $M_4$, $M_4'$) of the first and second pair of transistors (e.g., $M_1$, $M_3$; $M_1'$, $M_3'$; $M_2$, $M_4$; $M_2'$, $M_4'$) may be operated independently from each other. A third pair of transistors (e.g., $M_5'$, $M_6$; $M_5$, $M_6'$) of the second and the first memory cell 10 may be stacked vertically and connected at a common net 16, 26, 26 arranged transverse to the third pair of transistors (e.g., $M_5'$, $M_6$; $M_5$, $M_6'$). In some embodiments, each transistor (e.g., $M_5$, $M_5'$, $M_6$, $M_6'$) of the third pair of transistors (e.g., $M_5'$, $M_6$; $M_5$, $M_6'$) may be of the same type. The third pair of transistors (e.g., $M_5'$, $M_6$; $M_5$, $M_6'$) may share a common bit line (e.g., BL, BLn).

In some embodiments, a computer program product for designing a microelectronic device 100 may include a plurality of conducting layers 90. In some embodiments, the computer program product may include a computer readable storage medium having program instructions embodied therewith the program instructions executable by the computer system 212 to cause the computer system 212 to perform a method. In some embodiments, a processor may design a first power line (e.g., $V_{ss}$), design a second power line (e.g., $V_{dd}$), design a first memory cell 10 with at least six transistors (e.g., $M_1$, $M_2$, $M_3$, $M_4$, $M_5$, $M_6$), design a second memory cell 20 with at least six transistors (e.g., $M_1'$, $M_2'$, $M_3'$, $M_4'$, $M_5'$, $M_6'$). In some embodiments, a first pair of transistors (e.g., $M_1$, $M_3$; $M_1'$, $M_3'$) of the first memory cell 10 may be stacked vertically and connected at a common net 12, 22, arranged transverse to the first pair of transistors (e.g., $M_1$, $M_3$; $M_1'$, $M_3'$). In some embodiments, each transistor (e.g., $M_1$, $M_1'$, $M_3$, $M_3'$) of the first pair of transistors (e.g., $M_1$, $M_3$; $M_1'$, $M_3'$) may be of the same type.

The first pair of transistors (e.g., $M_1$, $M_3$; $M_1'$, $M_3'$) may share the first common power line (e.g., $V_{ss}$). In some embodiments, a second pair of transistors (e.g., $M_2$, $M_4$; $M_2'$, $M_4'$) of the first memory cell 10 may be stacked vertically and connected at a common net 14, 24, arranged transverse to the second pair of transistors (e.g., $M_2$, $M_4$; $M_2'$, $M_4'$). Each transistor (e.g., $M_2$, $M_2'$, $M_4$, $M_4'$) of the second pair of transistors (e.g., $M_2$, $M_4$; $M_2'$, $M_4'$) may be of the same type, and may be a different type than the first pair of transistors (e.g., $M_1$, $M_3$; $M_1'$, $M_3'$). The second pair of transistors (e.g., $M_2$, $M_4$; $M_2'$, $M_4'$) may share the second common power line (e.g., $V_{dd}$). In some embodiments, the transistors (e.g., $M_1$, $M_1'$, $M_2$, $M_2'$, $M_3$, $M_3'$, $M_4$, $M_4'$) of the first and second pair of transistors (e.g., $M_1$, $M_3$; $M_1'$, $M_3'$; $M_2$, $M_4$; $M_2'$, $M_4'$) may operate independently from each other. A third pair of transistors (e.g., $M_5'$, $M_6$; $M_5$, $M_6'$) of the second and the first memory cell 10 is stacked vertically and connected at a common net 16, 26, arranged transverse to the third pair of transistors (e.g., $M_5'$, $M_6$; $M_5$, $M_6'$). In some embodiments, each transistor (e.g., $M_5$, $M_5'$, $M_6$, $M_6'$) of the third pair of transistors (e.g., $M_5'$, $M_6$; $M_5$, $M_6'$) may be of the same type, wherein the third pair of transistors (e.g., $M_5'$, $M_6$; $M_5$, $M_6'$) may share a common bit line (e.g., BL, BLn).

The invention claimed is:

1. A microelectronic device comprising:
   a first pair of transistors comprising a top transistor stacked vertically above a bottom transistor and connected to a first common power line;
   a second pair of transistors comprising a top transistor stacked vertically above a bottom transistor and connected to a second common power line; and
   a third pair of transistors comprising a top transistor stacked vertically above a bottom transistor and connected to a common bit line;
   wherein the top transistor of the first pair of transistors, the top transistor of the second pair of transistors, and the top transistor of the third pair of transistors are all arranged in a first horizontal plane, and
   wherein the bottom transistor of the first pair of transistors, the bottom transistor of the second pair of transistors, and the bottom transistor of the third pair of transistors are all arranged in a second horizontal plane.

2. The microelectronic device according to claim 1, further comprising:
   a fourth pair of transistors comprising a top transistor stacked vertically above a bottom transistor and connected to the first common power line; and
   a fifth pair of transistors comprising a top transistor stacked vertically above a bottom transistor and connected to the second common power line,
   wherein the top transistor of the fourth pair of transistors and the top transistor of the fourth pair of transistors are all arranged in the first horizontal plane, and
   wherein the bottom transistor of the fourth pair of transistors and the bottom transistor of the fourth pair of transistors are all arranged in the second horizontal plane.

3. The microelectronic device according to claim 2, wherein the third pair of transistors is arranged directly between the second pair of transistors and the fourth pair of transistors.

4. The microelectronic device according to claim 1, wherein the first pair of transistors, the second pair of transistors, and the third pair of transistors are all arranged in a single vertical plane.

5. The microelectronic device according to claim 2, wherein the first pair of transistors, the second pair of transistors, the third pair of transistors, the fourth pair of transistors, and the fifth pair of transistors are all arranged in a single vertical plane.

6. The microelectronic device according to claim 1, further comprising:
   a first inverter comprising the bottom transistor of the first pair of transistors and the bottom transistor of the second pair of transistors; and
   a second inverter comprising the top transistor of the first pair of transistors and the top transistor of the second pair of transistors,
   wherein the first inverter and the second inverter are cross coupled.

7. The microelectronic device according to claim 1, wherein the bottom transistor of the third pair of transistors is connected to a first wordline, and wherein the top transistor of the third pair of transistors is connected to a second wordline.

8. A microelectronic device comprising:
a first transistor stacked vertically above a second transistor, wherein the first transistor and the second transistor are connected to a first common power line;
a third transistor stacked vertically above a fourth transistor, wherein the third transistor and the fourth transistor are connected to a second common power line; and
a fifth transistor stacked vertically above a sixth transistor, wherein the fifth transistor and the sixth transistor are connected to a common bit line,
wherein the first transistor, the third transistor, and the fifth transistor are all arranged in a first horizontal plane, and
wherein the second transistor, the fourth transistor, and the sixth transistor are all arranged in a second horizontal plane.

9. The microelectronic device according to claim 8, further comprising:
a seventh transistor stacked vertically above an eighth transistor, wherein the first transistor and the second transistor are connected to the first common power line; and
a ninth transistor stacked vertically above a tenth transistor, wherein the third transistor and the fourth transistor are connected to the second common power line,
wherein the seventh transistor and the ninth transistor are all arranged in the first horizontal plane, and
wherein the eighth transistor and the tenth transistor are all arranged in the second horizontal plane.

10. The microelectronic device according to claim 9, wherein the fifth transistor is arranged directly between the third transistor and the seventh transistor, and wherein the sixth transistor is arranged directly between the fourth transistor and the eighth transistor.

11. The microelectronic device according to claim 8, wherein the first transistor, the second transistor, the third transistor, the fourth transistor, the fifth transistor, and the sixth transistor are all arranged in a single vertical plane.

12. The microelectronic device according to claim 9, wherein the first transistor, the second transistor, the third transistor, the fourth transistor, the fifth transistor, the sixth transistor, the seventh transistor, the eighth transistor, the ninth transistor, and the tenth transistor are all arranged in a single vertical plane.

13. The microelectronic device according to claim 8, further comprising:
a first inverter comprising the second transistor and the fourth transistor; and a second inverter comprising the first transistor and the second transistor,
wherein the first inverter and the second inverter are cross coupled.

14. The microelectronic device according to claim 8, wherein the sixth transistor is connected to a first wordline, and wherein the fifth transistor is connected to a second wordline.

15. A microelectronic device comprising:
a first transistor stacked vertically above a second transistor, wherein the first transistor and the second transistor are connected to a first common power line;
a third transistor stacked vertically above a fourth transistor, wherein the third transistor and the fourth transistor are connected to a second common power line;
a fifth transistor stacked vertically above a sixth transistor, wherein the fifth transistor and the sixth transistor are connected to a common bit line; and
a seventh transistor adjacent to the second transistor,
wherein the first transistor, the third transistor, and the fifth transistor are all arranged in a first horizontal plane, and
wherein the second transistor, the fourth transistor, the sixth transistor, and the seventh transistor are all arranged in a second horizontal plane.

16. The microelectronic device according to claim 15, wherein the first transistor, the second transistor, the third transistor, the fourth transistor, the fifth transistor, the sixth transistor, and the seventh transistor are all arranged in a single vertical plane.

17. The microelectronic device according to claim 15, further comprising:
a first inverter comprising the second transistor and the fourth transistor; and
a second inverter comprising the first transistor and the second transistor,
wherein the first inverter and the second inverter are cross coupled.

18. The microelectronic device according to claim 15, wherein a gate of the sixth transistor and a gate of the seventh transistor are both connected to a first wordline, and wherein a gate of the fifth transistor is connected to a second wordline.

19. The microelectronic device according to claim 15, wherein a gate of the first transistor and a gate of the third transistor are connected to a complement signal associated with a first memory cell, and
wherein a gate of the second transistor and a gate of the fourth transistor are connected to a true signal associated with the first memory cell.

\* \* \* \* \*